(12) United States Patent
Yang et al.

(10) Patent No.: US 7,701,733 B2
(45) Date of Patent: Apr. 20, 2010

(54) METHOD AND APPARATUS TO PROVIDE SYNCHRONOUS RECTIFYING CIRCUIT FOR OFFLINE POWER CONVERTERS

(75) Inventors: Ta-yung Yang, Milpitas, CA (US); Tso-Min Chen, Taichung (TW)

(73) Assignee: System General Corp., Taipei Hsien (TW)

( * ) Notice: Subject to any disclaimer, the term of this patent is extended or adjusted under 35 U.S.C. 154(b) by 532 days.

(21) Appl. No.: 11/763,171

(22) Filed: Jun. 14, 2007

(65) Prior Publication Data
US 2008/0310203 A1    Dec. 18, 2008

(51) Int. Cl.
*H02M 3/335* (2006.01)
(52) U.S. Cl. .................. 363/21.06; 363/89
(58) Field of Classification Search ........... 363/21.06, 363/21.14, 84, 89, 125, 127
See application file for complete search history.

(56) References Cited

U.S. PATENT DOCUMENTS

| | | | | |
|---|---|---|---|---|
| 6,026,005 A * | 2/2000 | Abdoulin | ............... | 363/89 |
| 6,426,884 B1 * | 7/2002 | Sun | ............... | 363/17 |
| 6,870,747 B2 * | 3/2005 | Bridge | ............... | 363/21.06 |
| 6,995,991 B1 * | 2/2006 | Yang et al. | ............... | 363/21.14 |
| 7,173,835 B1 | 2/2007 | Yang | | |
| 7,599,198 B2 * | 10/2009 | Tao et al. | ............... | 363/17 |
| 7,616,457 B2 * | 11/2009 | Yang | ............... | 363/21.06 |
| 2002/0135342 A1 | 9/2002 | Tomioka | ............... | 323/282 |
| 2005/0024899 A1 | 2/2005 | Yang | ............... | 363/21.15 |
| 2007/0085720 A1 | 4/2007 | Fosler | ............... | 341/155 |
| 2009/0027926 A1 * | 1/2009 | Yang et al. | ............... | 363/21.14 |
| 2009/0091960 A1 * | 4/2009 | Yang | ............... | 363/127 |
| 2009/0141521 A1 * | 6/2009 | Yang | ............... | 363/49 |
| 2009/0219003 A1 * | 9/2009 | Yang | ............... | 323/283 |

FOREIGN PATENT DOCUMENTS

| | | |
|---|---|---|
| JP | 2001-069756 | 3/2001 |
| JP | 2005-020970 | 1/2005 |

* cited by examiner

*Primary Examiner*—Adolf Berhane
(74) *Attorney, Agent, or Firm*—J.C. Patents

(57) ABSTRACT

A synchronous rectifying circuit is provided for power converter. A pulse signal generator is utilized to generate a pulse signal in response to the leading edge and the trailing edge of a switching signal. The switching signal is used for switching the transformer of the power converter. An isolation device such as pulse transformer or small capacitors is coupled to the pulse signal generator for transferring the pulse signal through an isolation barrier of a transformer. A synchronous rectifier includes a power switch and a control circuit. The power switch is equipped in between the secondary side of the transformer and the output of the power converter for the rectifying. The control circuit having a latch is operated to receive the pulse signal for turning on/off the power switch.

23 Claims, 6 Drawing Sheets

US 7,701,733 B2

METHOD AND APPARATUS TO PROVIDE SYNCHRONOUS RECTIFYING CIRCUIT FOR OFFLINE POWER CONVERTERS

BACKGROUND OF THE INVENTION

1. Field of the Invention

The present invention in general relates to a control circuit of a power converter, and more particularly, to a synchronous rectifying control circuit for a power converter.

2. Description of Related Art

An offline power converter includes a power transformer to provide isolation from AC line input to the output of the power converter for safety. In recent development, applying the synchronous rectifier in the secondary side of the transformer is to achieve a high efficiency conversion for power converters, such as "Control circuit associated with saturable inductor operated as synchronous rectifier forward power converter" by Yang, U.S. Pat. No. 7,173,835. However, the disadvantage of this prior art is an additional power consumptions caused by saturable inductors and/or current-sense devices. The saturable inductor and the current-sense device are needed to facilitate the synchronous rectifier operated in both continuous mode and discontinuous mode operations.

SUMMARY OF THE INVENTION

The present invention provides a synchronous rectifying circuit, which can achieve higher efficiency. Besides, no current sense device and saturable inductor are required for both continuous mode and discontinuous mode operations.

The present invention is directed to a synchronous rectifying circuit to improve the efficiency of the power converter, which includes a pulse signal generator for generating a pulse signal in response to the rising edge and the falling edge of a switching signal. The switching signal is utilized to switch a transformer and regulate the power converter. An isolation device, such as a pulse transformer or capacitors, is coupled to the pulse signal generator to transfer the pulse signal from the primary side of the transformer to the secondary side of the transformer. A synchronous rectifier has a power switch and a control circuit. The power switch is coupled to the secondary side of the transformer for the rectifying operation. The power switch functions as a synchronous rectifier. The control circuit is operated to receive the pulse signal for turning on/off the power switch. The pulse signal is a trig signal. The pulse width of the pulse signal is shorter than the pulse width of the switching signal.

BRIEF DESCRIPTION OF ACCOMPANIED DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DETAILED DESCRIPTION OF PREFERRED EMBODIMENTS

Figure 1:
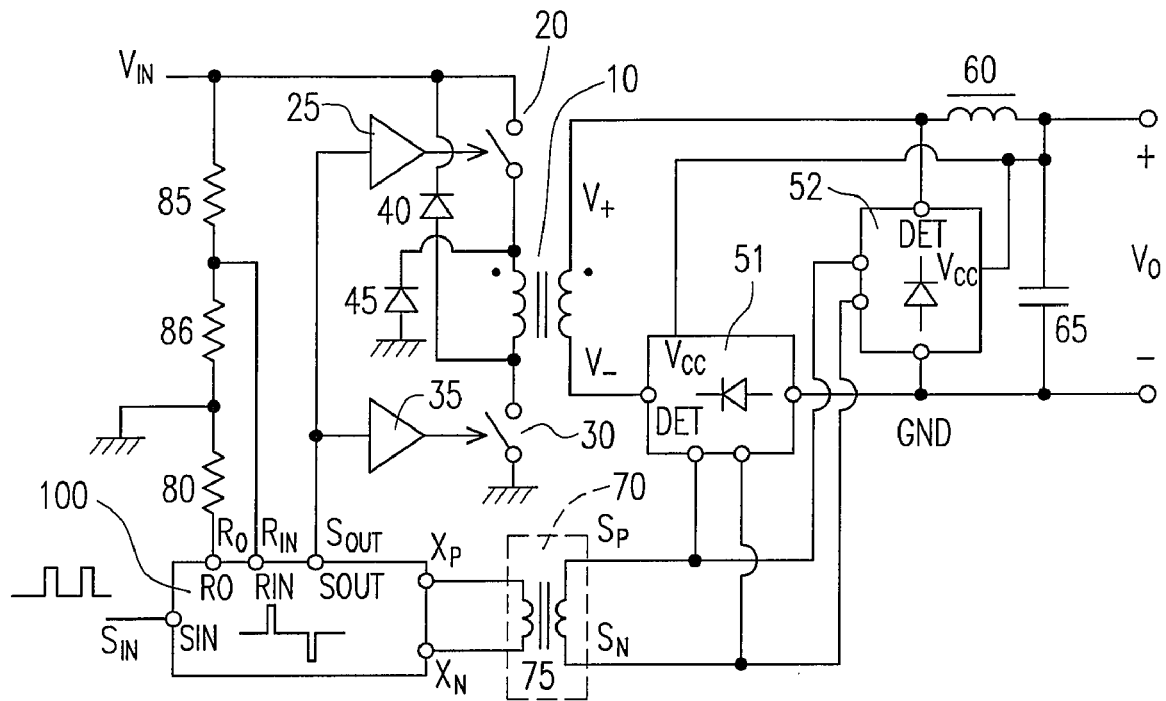
FIG. 1 shows an embodiment of a power converter with synchronous rectifier according to present invention.

FIG. 1 shows a power converter with synchronous rectifier according to an embodiment of the present invention. The power converter includes a transformer 10 having a primary side and a secondary side. The primary side of the transformer 10 has two power switches 20 and 30 for switching the transformer 10. The secondary side includes a first terminal V+ and a second terminal V−. A switching voltage is produced across the second terminal V− and the first terminal V+ in response to the switching of the transformer 10. A first synchronous rectifier 51 has a rectifying terminal DET connected to the second terminal V−. The ground terminal GND of the first synchronous rectifier 51 is connected to the ground of the power converter. A second synchronous rectifier 52 is connected from the first terminal V+ to the ground of the power converter. An inductor 60 is connected from the first terminal V+ to the output $V_O$ of the power converter. The first input terminal $S_P$, the second input terminal $S_N$ of the first synchronous rectifier 51 and the second synchronous rectifier 52 are connected to the secondary side of an isolation device 70 to receive a pulse signal for turning on or turning off the synchronous rectifiers 51 and 52. The isolation device 70 can be, for example, a pulse transformer 75, or capacitors.

A pulse signal generator 100 has an input signal terminal SIN coupled to receive a switching signal $S_{IN}$ for generating the pulse signal in response to the rising (leading) edge and the falling (trailing) edge of the switching signal $S_{IN}$. The switching signal $S_{IN}$ is developed to switch the transformer 10 and regulate the power converter. The pulse signal, which is a differential signal, is produced on a first output terminal $X_P$ and a second output terminal $X_N$ of the pulse signal generator 100. The polarity of the pulse signal determines turning on or turning off the synchronous rectifiers 51 and 52. In order to produce the pulse signal before the transformer 10 is switched, the pulse signal generator 100 further generates a drive signal $S_{OUT}$ at the output terminal SOUT in response to the switching signal $S_{IN}$. The drive signal $S_{OUT}$ is coupled to switch the transformer 10 through drive-buffers 25, 35 and power switches 20, 30. A time delay is developed between the enabling of the switching signal $S_{IN}$ and the enabling of the drive signal $S_{OUT}$.

The first output terminal $X_P$ and the second output terminal $X_N$ of the pulse signal generator 100 are coupled to the isolation device 70 to transfer the pulse signal from the primary side to the secondary side of the transformer 10. The pulse width of the pulse signal is shorter than the pulse width of the switching signal $S_{IN}$. The pulse signal is a trig signal that includes high frequency elements. Therefore, only a small pulse transformer or small capacitors is required, which would utilize smaller space on the PCB and reduce the cost of the power converter. The pulse signal generator 100 further includes an input voltage terminal RIN coupled to receive an input voltage signal representative of an input voltage VIN of the transformer 10. The input voltage terminal RIN is coupled to the input voltage $V_{IN}$ via a voltage divider composed of, for example, resistors 85 and 86. A program terminal RO of the pulse signal generator 100 is coupled to receive a program signal through a resistor 80. When the power converter is operated in discontinuous mode, the pulse signal generator 100 can thus produce an additional pulse signal to turn off the synchronous rectifiers 51 and 52 in accordance with the input voltage signal, the program signal and the pulse width of the switching signal $S_{IN}$.

Figure 2:
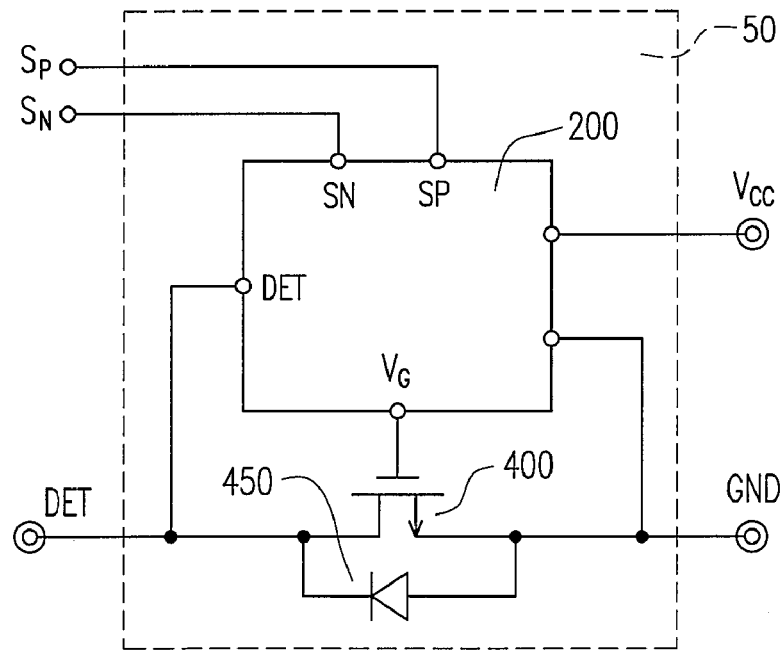
FIG. 2 is a schematic diagram of a synchronous rectifier according to present invention.

FIG. 2 is a schematic diagram of a synchronous rectifier 50 according to an embodiment of the present invention, which represents a circuit of the synchronous rectifier 51 or the synchronous rectifier 52. The synchronous rectifier 50 includes a power switch 400, a diode 450 and a control circuit 200. The diode 450 is connected to the power switch 400 in parallel. The power switch 400 is connected in between a rectifying terminal DET and a ground terminal GND. The rectifying terminal DET is coupled to the secondary side of the transformer 10. The ground terminal GND is coupled to the output of the power converter. The control circuit 200 is coupled to receive the pulse signal via a first input terminal SP and a second input terminal SN for turning on/off the power switch 400. A VCC terminal is utilized to supply the power source to the control circuit 200.

Figure 3:
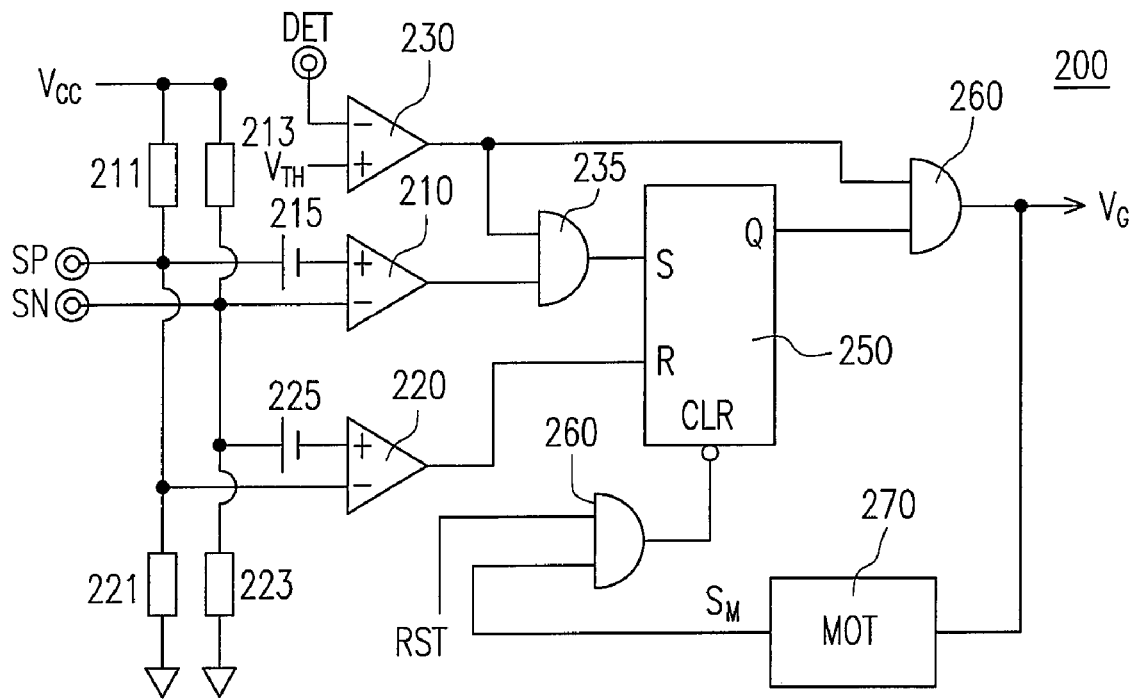
FIG. 3 is an embodiment of a control circuit of a synchronous rectifier according to present invention.

FIG. 3 shows the control circuit 200 according to an embodiment of the present invention. Resistors 211 and 221 provide a bias termination for the first input terminal SP. Resistors 213 and 223 provide another bias termination for the second input terminal SN. The first input terminal SP is coupled to the positive input of a comparator 210 and the negative input of a comparator 220. The second input terminal SN is coupled to the positive input of a comparator 220 and the negative input of a comparator 210. Comparators 210 and 220 have offset voltages 215 and 225 respectively, which produces hysteresis. A third comparator 230 having a threshold $V_{TH}$ connects to its positive input. The negative input of the comparator 230 is coupled to the rectifying terminal DET. The outputs of comparators 210 and 230 are coupled to the set-input of a SR flip-flop 250 through an AND gate 235. The reset-input of the SR flip-flop 250 is controlled by the output of the comparator 220. The output of the SR flip-flop 250 and the output of the comparator 230 are connected to an AND gate 260. A gate-drive signal $V_G$ is generated at the output of the AND gate 260 for controlling the ON status or OFF status of the power switch 400. The maximum on time of the gate-drive signal $V_G$ is limited by a maximum on time circuit (MOT) 270. The gate-drive signal $V_G$ is connected to the maximum on time circuit 270. After a blanking time, a maximum-on-time signal $S_M$ will be produced in response to the enabling of the gate-drive signal $V_G$. The maximum-on-time signal $S_M$ is connected to an AND gate 260. Another input of the AND gate 260 is connected to a power-on reset signal RST. The output of the AND gate 260 is coupled to clear (reset) the SR flip-flop 250. The maximum on time of the gate-drive signal $V_G$ is thus limited by the blanking time of the maximum on time circuit 270. The gate-drive signal $V_G$ will turn off the power switch 400 once the pulse signal is generated as, $$V_{SN} - V_{SP} > V_{225} \tag{1}$$

The gate-drive signal VG will turn on the power switch 400 when equations (2) and (3) are met, $$V_{SP} - V_{SN} > V_{215} \tag{2}$$

$$V_{DET} < V_{TH} \tag{3}$$

where $V_{SP}$ is the voltage of the first input terminal SP; $V_{SN}$ is the voltage of the second input terminal SN. $V_{DET}$ is the voltage of the rectifying terminal DET. $V_{TH}$ is the voltage of the threshold VTH; $V_{215}$ is the value of the offset voltage 215; $V_{225}$ is the value of the offset voltage 225.

The voltage of the rectifying terminal DET will be lower than the voltage of the threshold VTH once the diode 450 is conducted. It shows the power switch 400 can only be turned on after the diode is turned on.

Figure 4:
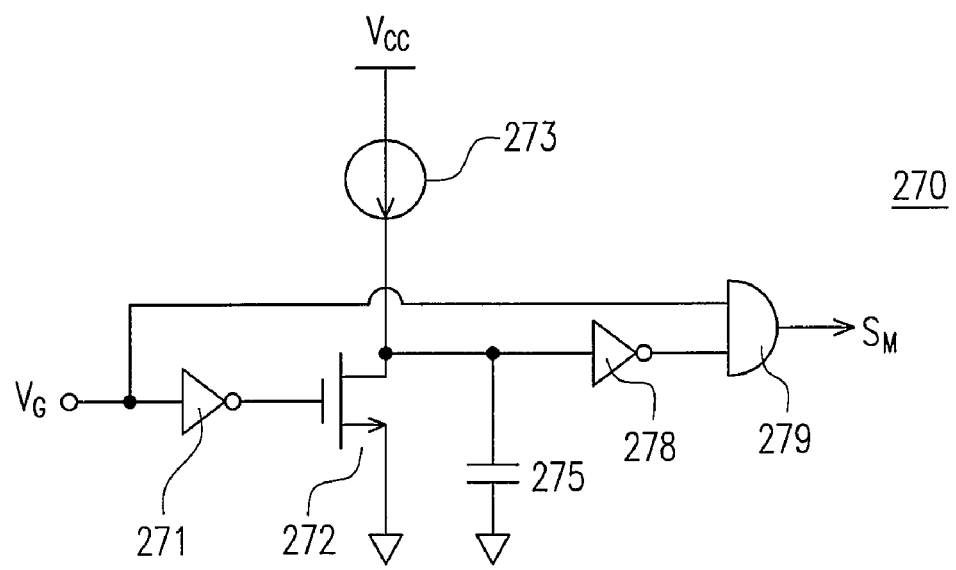
FIG. 4 is a maximum on time (MOT) circuit according to present invention.

FIG. 4 is the maximum on time circuit 270 according to an embodiment of the present invention. A current source 273 is connected to charge a capacitor 275. A transistor 272 is connected to discharge the capacitor 275. The gate-drive signal $V_G$ is coupled to control the transistor 272 through an inverter 271. The gate-drive signal $V_G$ is further connected to an AND gate 279. Another input of the AND gate 279 is coupled to the capacitor 275 via an inverter 278. Once the gate-drive signal $V_G$ is enabled, the output of the AND gate 279 will generate the maximum-on-time signal $S_M$ to disable the gate-drive signal $V_G$ after the blanking time. The blanking time is determined by the current of the current source 273 and the capacitance of the capacitor 275.

Figure 5:
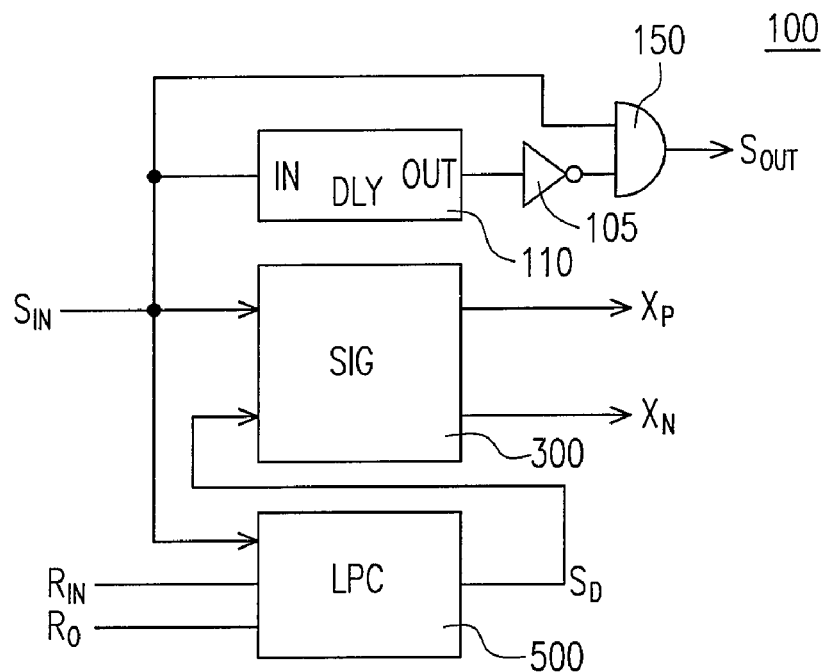
FIG. 5 is a block schematic diagram of a pulse signal generator according to present invention.

FIG. 5 is the block schematic of the pulse signal generator 100 according to an embodiment of the present invention. The drive signal $S_{OUT}$ is generated in response to the switching signal $S_{IN}$. The switching signal $S_{IN}$ is connected to the input of a delay circuit 110. The output of the delay circuit 110 is connected to the input of an AND gate 150 through an inverter 105. Another input of the AND gate 150 is coupled to the switching signal $S_{IN}$. The output of the AND gate 150 generates the drive signal $S_{OUT}$ and is coupled to switch the transformer 10. A time delay is thus developed between the enabling of the switching signal $S_{IN}$ and the enabling of the drive signal $S_{OUT}$. The pulse signal generator 100 further includes an input voltage terminal RIN coupled to receive an input voltage signal representative to an input voltage $V_{IN}$ of the transformer 10. A program terminal RO is coupled to receive a program signal stands for the output voltage information of the power converter. The program signal, the input voltage signal and the drive signal $S_{OUT}$ are coupled to a linear-predict circuit 500. The linear-predict circuit 500 will generate a discontinuous-mode signal $S_D$ to turn off the power switch in accordance with the input voltage signal, the program signal and the pulse width of the switching signal $S_{IN}$. Both the discontinuous-mode signal $S_D$ and the switching signal $S_{IN}$ are coupled to the signal generation circuit 300 to generate the pulse signal on the first output terminal $X_P$ and the second output terminal $X_N$.

Figure 6:
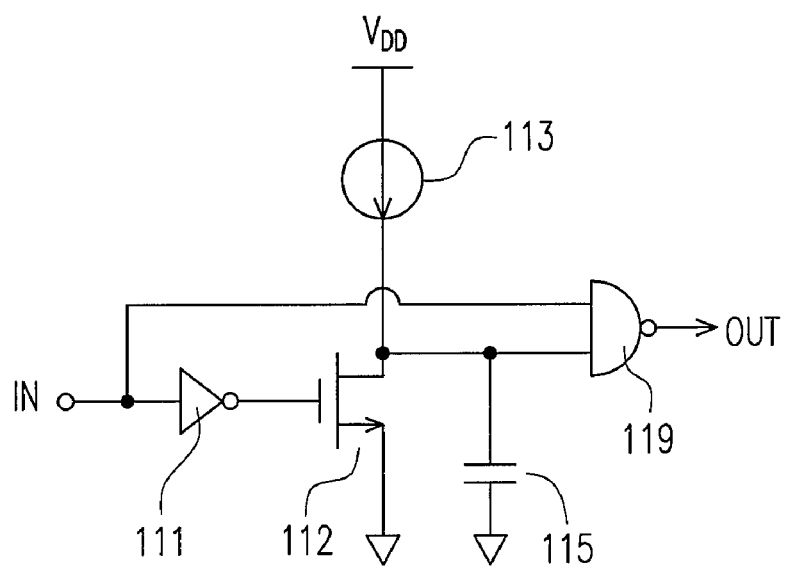
FIG. 6 shows a circuit schematic diagram of a delay circuit.

FIG. 6 shows the circuit schematic of an example of a delay circuit. A current source 113 is connected to charge a capacitor 115. A transistor 112 is connected to discharge the capacitor 115. The input signal is coupled to control the transistor 112 through an inverter 111. The input signal is further connected to an NAND gate 119. Another input of the NAND gate 119 is coupled to the capacitor 115. The output of the NAND gate is the output of the delay circuit. When the input signal is a logic-low, the capacitor 115 is discharged and the output of the NAND gate 119 is the logic-high. When the input signal is changed to the logic-high, the current source 113 will start to charge the capacitor 115. The NAND gate 119 will output a logic-low once the voltage of the capacitor 115 is higher than the input threshold of the NAND gate 119. The current of the current source 113 and the capacitance of the capacitor 115 determine the delay time $T_P$ of the delay circuit. The delay time $T_P$ is started from the logic-high of the input signal to the logic-low of the output signal of the delay circuit.

Figure 7:
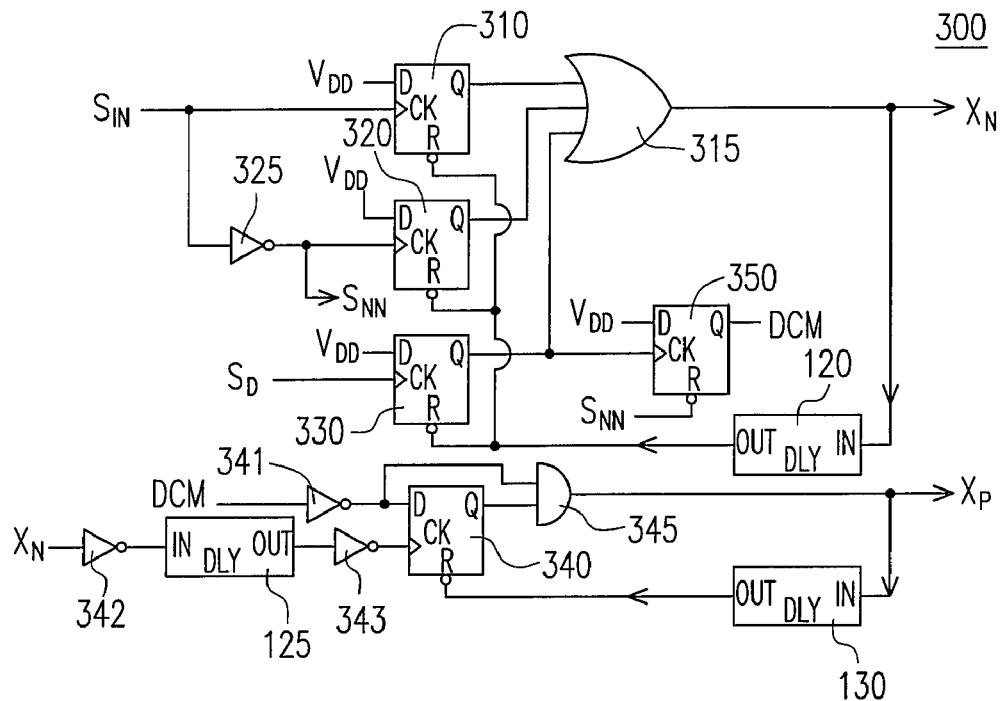
FIG. 7 is an embodiment of a signal generation circuit according to present invention.

FIG. 7 is a circuit of the signal generation circuit 300 according to an embodiment of the present invention. The clock-input of a flip-flop 310 is coupled to receive the switching signal $S_{IN}$ and generates a first signal connected to the first-input of an OR gate 315. The switching signal $S_{IN}$ further generates a signal $S_{NN}$ through an inverter 325. The signal $S_{NN}$ is connected to drive the clock-input of a flip-flop 320. The flip-flop 320 outputs a second signal and is connected to the second-input of the OR gate 315. The clock-input of a flip-flop 330 is coupled to receive the discontinuous-mode signal $S_D$ and generates a third signal at the output of the flip-flop 330. The third signal is connected to the third-input of an OR gate 315. The OR gate 315 is utilized to generate a negative-pulse signal at the second output terminal $X_N$ for turning off synchronous rectifier 50. The negative-pulse signal is coupled to reset flip-flops 310, 320 and 330 through a delay circuit 120. The delay time of the delay circuit 120 determines the pulse width of the negative-pulse signal. The third signal is further coupled to the clock-input of a flip-flop 350 to generate a signal DCM at the output of the flip-flop 350. The signal DCM is coupled to the D-input of a flip-flop 340 and the input of an AND gate 345. The clock-input of the flip-flop 340 is coupled to the second output terminal $X_N$ through an inverter 343, a delay circuit 125 and another inverter 342 to receive the negative-pulse signal. The output of the flip-flop 340 is connected to another input of the AND gate 345. The AND gate 345 is utilized to generate a positive-pulse signal at the first output terminal $X_P$. The positive-pulse signal is coupled to reset the flip-flop 340 via a delay circuit 130. The delay time of the delay circuit 130 determines the pulse width of the positive-pulse signal. The pulse signal is therefore developed by the positive-pulse signal and the negative-pulse signal on the first output terminal $X_P$ and the second output terminal $X_N$.

Figure 8:
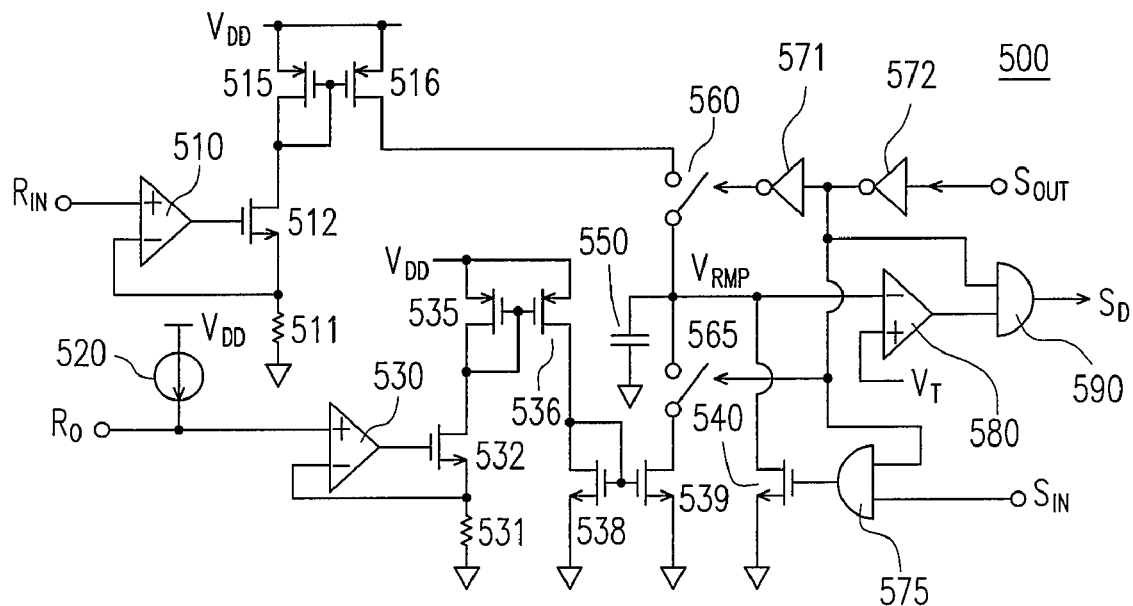
FIG. 8 is an embodiment of a linear-predict circuit according to present invention.

FIG. 8 is the linear-predict circuit 500 according to an embodiment of the present invention. An operational amplifier 510, transistors 512, 515 and 516 and a resistor 511 develop a voltage-to-current converter. The operational amplifier 510 is coupled to the input voltage terminal RIN to receive the input voltage signal for generating a charge-current at the transistor 516. A current source 520 is coupled to the program terminal RO to generate the program signal associated with the resistor 80. An operational amplifier 530, a resistor 531 and transistors 532, 535, 536, 538 and 539 develop another voltage-to-current converter. The operational amplifier 530 is coupled to the program terminal RO to receive the program signal for generating a discharge-current at the transistor 539. The charge-current is coupled to charge a capacitor 550 via a switch 560. The discharge-current is coupled to discharge the capacitor 550 through a switch 565. An inverter 572 is coupled to the output terminal SOUT to receive the drive signal $S_{OUT}$ for producing a discharge signal. The discharge signal is connected to control the switch 565. The discharge signal is further connected to an inverter 571 to generate a charge signal for controlling the switch 560. A ramp signal $V_{RMP}$ is generated at the capacitor 550. The positive input of a comparator 580 has a threshold $V_T$. The negative input of the comparator 580 is coupled to the ramp signal $V_{RMP}$. The output of the comparator 580 and the discharge signal are connected to an AND 590 to generate the discontinuous-mode signal $S_D$. Furthermore, the discharge signal and the switching signal $S_{IN}$ are coupled to reset the capacitor 550 through a transistor 540 and an AND gate 575. The discontinuous-mode signal $S_D$ is therefore generated in response to the input voltage signal, the program signal and the pulse width of the switching signal $S_{IN}$.

When the power converter is operated in the boundary mode, the magnetized flux $\Phi_C$ of the inductor is equal to the demagnetized flux $\Phi_D$. The boundary mode means the power converter is operated between the continuous mode and the discontinuous mode.

The equality is shown as, $$\Phi_C = \Phi_D \qquad (4)$$

$$\Phi = B \times Ae = \frac{V \times T}{N} \qquad (5)$$

$$\left[\left(\frac{V_{IN} \times N_S}{N_P}\right) - V_O\right] \times T_{CHARGE} = V_O \times T_{DISCHARGE} \qquad (6)$$

$$T_{DISCHARGE} = \left\{\left[\left(\frac{V_{IN} \times N_S}{N_P}\right) - V_O\right] \Big/ V_O\right\} \times T_{CHARGE} \qquad (7)$$

where B is the flux density; Ae is the cross-section area of the inductor 60; the magnetized time ($T_{CHARGE}$) is the pulse width of the switching signal $S_{IN}$; the demagnetized time ($T_{DISCCHARGE}$) of the inductor 60 shows the boundary condition of the power converter.

The demagnetized time $T_{DISCHARGE}$ of the inductor 60 can be obtained in accordance with equation (7). It also shows that the demagnetized time $T_{DISCHARGE}$ can be predicted in accordance with the input voltage $V_{IN}$, the output voltage $V_O$ and the magnetized time $T_{CHARGE}$ (the pulse width of the switching signal $S_{IN}$). The discontinuous-mode signal $S_D$ is generated in response to the demagnetized time $T_{DISCHARGE}$.

Figure 9A:
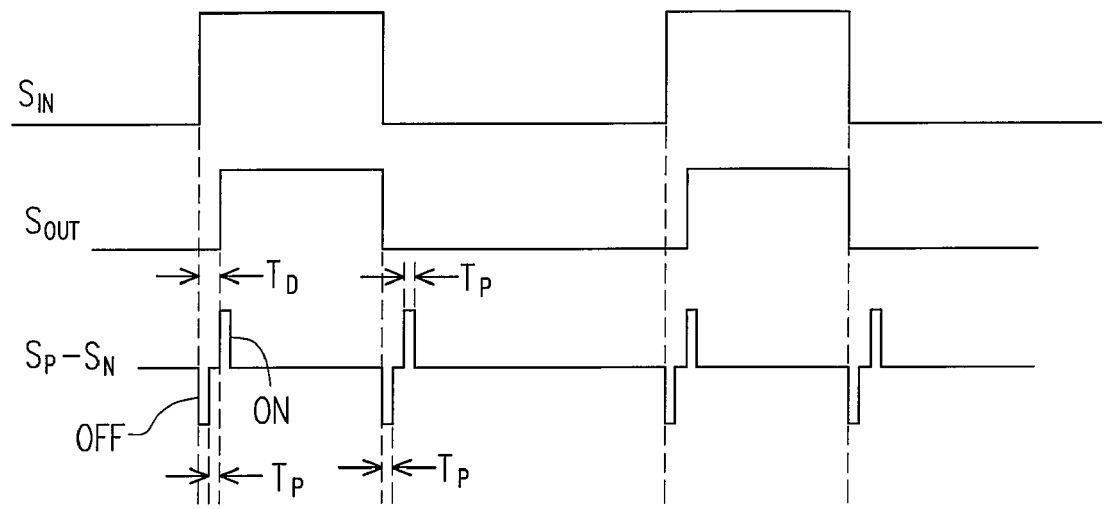
FIGS. 9A and 9B show key waveforms of the synchronous rectifying circuit according to present invention.
Figure 9B:
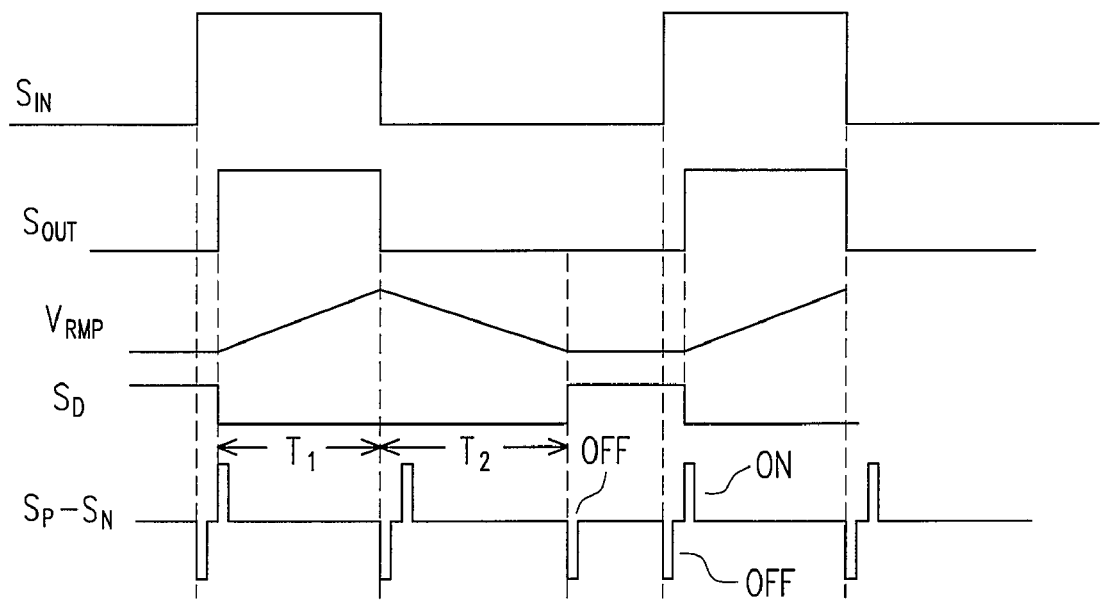

FIGS. 9A and 9B show key waveforms of the synchronous rectifying circuit. FIG. 9A shows a pulse signal $S_P$-$S_N$ (negative pulse signal) is generated in response to the leading edge and the trailing edge of the switching signal $S_{IN}$ to disable synchronous rectifier 50. Following the end of the negative pulse signal, a pulse signal $S_P$-$S_N$ (positive pulse signal) is generated to enable synchronous rectifier 50 if the diode 450 of the synchronous rectifier 50 is conducted. FIG. 9B shows the waveform of the ramp signal $V_{RMP}$. The discontinuous-mode signal $S_D$ and the additional pulse signal $S_P$-$S_N$ (negative pulse signal) are generated at the end of the discharge time of the ramp signal $V_{RMP}$. It means the synchronous rectifier 50 will be disabled when the inductor 60 is fully demagnetized (discontinuous mode).

Figure 10:
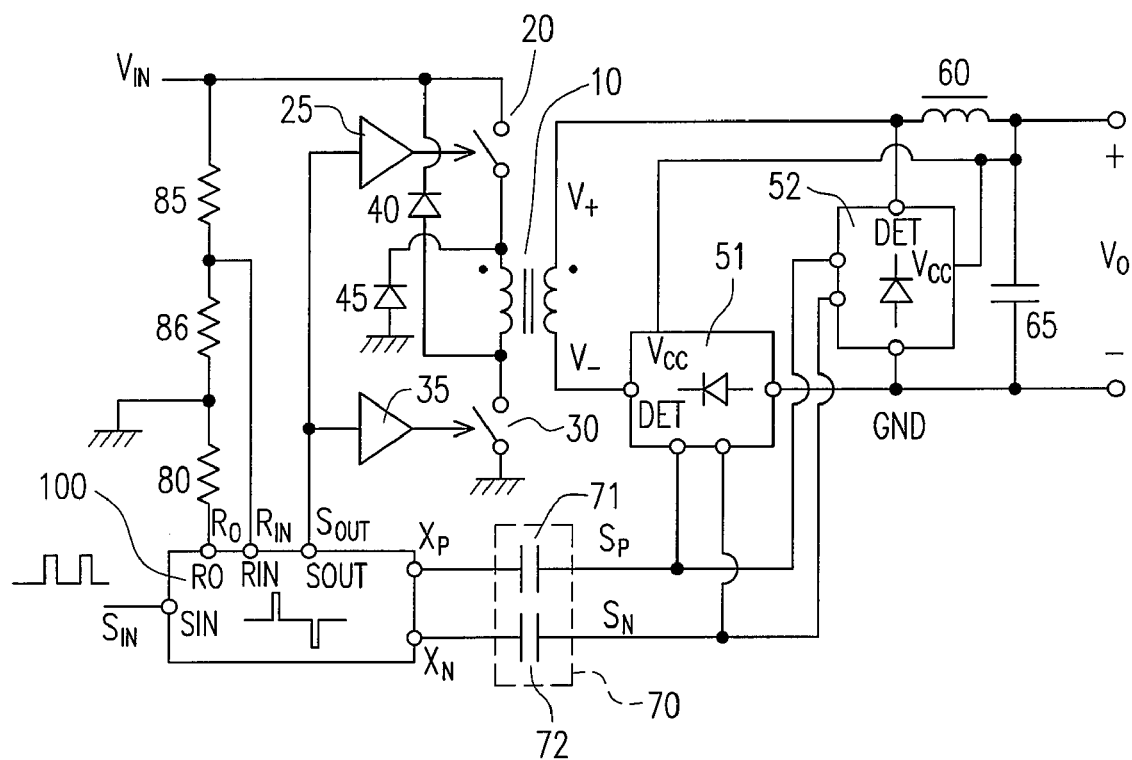
FIG. 10 shows another embodiment of a circuit schematic of a power converter with synchronous rectifier according to present invention, in which capacitors operated as an isolation device.

FIG. 10 shows an embodiment of a power converter with synchronous rectifier according to the present invention, which is similar to the embodiment described with reference to FIG. 1, except for capacitors 71 and 72 being operated as the isolation device 70 for synchronous rectifying circuit. The capacitance of capacitors 71 and 72 can be smaller than 20 pF, but the high-voltage rating of the capacitor is required for the isolation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A synchronous rectifying circuit for power converter, comprising:

a pulse signal generator, for generating a pulse signal in response to a rising edge and a falling edge of a switching signal;

an isolation device, coupled to the pulse signal generator, for transferring the pulse signal from a primary side of a transformer to a secondary side of a transformer; and a synchronous rectifier, having a power switch, a diode and a control circuit; wherein the power switch is coupled to the secondary side of the transformer for rectifying, wherein the control circuit is operated to receive the pulse signal for turning on or turning off the power switch, wherein the switching signal is used for switching the transformer of the power converter, the diode is coupled to the power switch in parallel, and the polarity of the pulse signal determines the pulse signal is coupled to turn on or turn off the power switch.

2. The synchronous rectifying circuit as claimed in claim 1, wherein the power switch can be turned on by the pulse signal once the diode is conducted.

3. The synchronous rectifying circuit as claimed in claim 1, wherein the isolation device is a pulse transformer or capacitors.

4. The synchronous rectifying circuit as claimed in claim 1, wherein the pulse signal is a trig signal, a pulse width of the pulse signal is shorter than a pulse width of the switching signal.

5. The synchronous rectifying circuit as claimed in claim 1, wherein the pulse signal generator further generates a drive signal in response to the switching signal, the drive signal is coupled to switch the transformer, and a time delay is developed between the enabling of the switching signal and the enabling of the drive signal.

6. The synchronous rectifying circuit as claimed in claim 1, wherein the pulse signal generator comprises:
an input voltage terminal, coupled to receive an input voltage signal representative of an input voltage of the transformer; and
a program terminal, coupled to receive a program signal;
wherein the pulse signal generator produces the pulse signal to turn off the power switch in accordance with the input voltage signal, the program signal and a pulse width of the switching signal.

7. The synchronous rectifying circuit as claimed in claim 1, wherein the pulse signal generator comprises:
an input signal terminal, coupled to receive the switching signal;
a first output terminal; and
a second output terminal;
wherein the first output terminal and the second output terminal generate the pulse signal, wherein the pulse signal is a differential signal, and wherein the polarity of the pulse signal determines the pulse signal is generated for turning on or off the power switch.

8. The synchronous rectifying circuit as claimed in claim 1, wherein the synchronous rectifier comprises:
a rectifying terminal, coupled to the secondary side of the transformer;
a ground terminal, coupled to an output of the power converter;
a first input terminal; and
a second input terminal;
wherein the power switch is connected between the rectifying terminal and the ground terminal, and wherein the first input terminal and the second input terminal are coupled to receive the pulse signal for turning on/off the power switch.

9. The synchronous rectifying circuit as claimed in claim 1, wherein the control circuit comprises a latch circuit coupled to the first input terminal and the second input terminal to receive the pulse signal to set or reset the latch circuit, and wherein the latch circuit is coupled to turn on/off the power switch.

10. A synchronous rectifier apparatus for power converter, comprising:
a pulse signal generator, for generating a pulse signal in response, to a leading edge and a trailing edge of a switching signal;
an isolation device, coupled to transfer the pulse signal through an isolation barrier of a transformer; and
a synchronous rectifier, having a power switch and a control circuit; wherein the power switch is coupled to the transformer for the rectifying operation, and wherein the control circuit is operated to receive the pulse signal for turning on/off the power switch;
wherein the switching signal is used for switching the transformer of the power converter, and the pulse signal is coupled to set or rest a latch circuit of the control circuit for controlling the power switch.

11. The synchronous rectifier apparatus as claimed in claim 10, further comprising a diode coupled to the power switch in parallel, wherein the power switch can be turned on by the pulse signal once the diode is conducted.

12. The synchronous rectifier apparatus as claimed in claim 10, wherein the isolation device is capacitors or a pulse transformer.

13. The synchronous rectifier apparatus as claimed in claim 10, wherein the pulse signal is a trig signal, and a pulse width of the pulse signal is shorter than a pulse width of the switching signal.

14. The synchronous rectifier apparatus as claimed in claim 10, wherein the pulse signal generator comprises:
an input voltage terminal, coupled to receive an input voltage signal representative of an input voltage of the transformer; and
a program terminal, coupled to receive a program signal;
wherein the pulse signal is generated to turn off the power switch in accordance with the input voltage signal, the program signal and a pulse width of the switching signal.

15. The synchronous rectifier apparatus as claimed in claim 10, wherein the pulse signal generator comprises:
an input signal terminal, coupled to receive the switching signal;
a first output terminal; and
a second output terminal;
wherein the pulse signal is generated at the first output terminal and the second output terminal.

16. The synchronous rectifier apparatus as claimed in claim 10, wherein the synchronous rectifier comprises:
a rectifying terminal, coupled to the secondary side of the transformer;
a ground terminal, coupled to an output of the power converter;
a first input signal terminal; and
a second input signal terminal;
wherein the power switch is connected between the rectifying terminal and the ground terminal, and the first input signal terminal and the second input signal terminal are coupled to receive the pulse signal for turning on/off the power switch.

17. The synchronous rectifier apparatus as claimed in claim 10, wherein the maximum on time of the power switch is limited by a maximum on time circuit.

18. A method for providing synchronous rectifying circuit of power converter, comprising:
generating a pulse signal in response to a leading edge and a trailing edge of a switching signal;

transferring the pulse signal from a primary side of a transformer to a secondary side of a transformer through an isolation barrier;

setting or resetting a latch in response to the pulse signal; and turning on/off a power switch in accordance with a status of the latch;

wherein the switching signal is used for switching the transformer of the power converter, and the power switch is coupled to the secondary side of the transformer for rectifying.

19. The method for providing synchronous rectifying circuit as claimed in claim 18, wherein the latch can be enabled to turn on the power switch only when a diode is conducted, wherein the diode is coupled to the power switch in parallel.

20. The method for providing synchronous rectifying circuit as claimed in claim 18, wherein the isolation device is a pulse transformer or capacitors.

21. The method for providing synchronous rectifying circuit as claimed in claim 18, wherein a pulse width of the pulse signal is shorter than a pulse width of the switching signal.

22. The method for providing synchronous rectifying circuit as claimed in claim 18, further comprising:

receiving an input voltage signal representative of an input voltage of the transformer; and receiving a program signal;

wherein the pulse signal is generated to turn off the power switch in accordance with the input voltage signal, the program signal and a pulse width of the switching signal.

23. The method for providing synchronous rectifying circuit as claimed in claim 18, wherein a maximum on time of the power switch is limited by a maximum on time circuit.

* * * * *